United States Patent
Guo

(10) Patent No.: US 8,963,222 B2
(45) Date of Patent: Feb. 24, 2015

(54) SPIN HALL EFFECT MAGNETIC-RAM

(71) Applicant: Yimin Guo, San Jose, CA (US)

(72) Inventor: Yimin Guo, San Jose, CA (US)

( * ) Notice: Subject to any disclaimer, the term of this patent is extended or adjusted under 35 U.S.C. 154(b) by 0 days.

(21) Appl. No.: 14/252,545

(22) Filed: Apr. 14, 2014

(65) Prior Publication Data

US 2014/0312441 A1     Oct. 23, 2014

Related U.S. Application Data

(60) Provisional application No. 61/812,721, filed on Apr. 17, 2013.

(51) Int. Cl.
   *H01L 29/76*     (2006.01)
   *H01L 43/04*     (2006.01)

(52) U.S. Cl.
   CPC ............................... *H01L 43/04* (2013.01)
   USPC ............ 257/295; 257/421; 257/422; 365/158

(58) Field of Classification Search
   USPC ............................ 257/295, 421, 422; 365/158
   See application file for complete search history.

(56) References Cited

U.S. PATENT DOCUMENTS

| | | | | |
|---|---|---|---|---|
| 7,298,579 B2* | 11/2007 | Asakura et al. | ............ | 360/77.08 |
| 2006/0221509 A1* | 10/2006 | Carey et al. | ................ | 360/324.2 |
| 2014/0198564 A1* | 7/2014 | Guo | ............................... | 365/158 |
| 2014/0210025 A1* | 7/2014 | Guo | ............................... | 257/421 |
| 2014/0217487 A1* | 8/2014 | Guo | ............................... | 257/295 |

* cited by examiner

*Primary Examiner* — Long Pham

(57) ABSTRACT

A spin Hall effect magnetoresistive memory comprises apparatus of a three terminal magnetoresistive memory cell having an MTJ stack, a functional magnetic layer having a magnetization anti-parallel or parallel coupled with a recording layer magnetization in the MTJ stack, and a SHE-metal base layer. The control circuitry coupled through the bit line and the two select transistors to selected ones of the plurality of magnetoresistive memory elements to supply a reading current across the magnetoresistive element stack and two bottom electrodes and to supply a bi-directional spin Hall effect recording current, and accordingly to directly switch the magnetization of the functional magnetic coupling layer and indirectly switching the magnetization of the recording layer through the coupling between the functional magnetic coupling layer and the recording layer.

20 Claims, 3 Drawing Sheets

SPIN HALL EFFECT MAGNETIC-RAM

RELATED APPLICATIONS

This application claims the priority benefit of U.S. Provisional Application No. 61/812,721 filed on Apr. 17, 2013, which is incorporated herein by reference.

BACKGROUND OF THE INVENTION

1. Field of the Invention

This invention relates generally to a three-terminal spin Hall effect magnetic-random-access memory (MRAM) element having a functional magnetic coupling layer and a spin hall effect base layer.

2. Description of the Related Art

In recent years, magnetic random access memories (hereinafter referred to as MRAMs) using the magnetoresistive effect of ferromagnetic tunnel junctions (also called MTJs) have been drawing increasing attention as the next-generation solid-state nonvolatile memories that can also cope with high-speed reading and writing. A ferromagnetic tunnel junction has a three-layer stack structure formed by stacking a recording layer having a changeable magnetization direction, an insulating tunnel barrier layer, and a fixed layer that is located on the opposite side from the recording layer and maintains a predetermined magnetization direction. Corresponding to the parallel and anti-parallel magnetic states between the recording layer magnetization and the reference layer magnetization, the magnetic memory element has low and high electrical resistance states, respectively. Accordingly, a detection of the resistance allows a magnetoresistive element to provide information stored in the magnetic memory device.

Typically, MRAM devices are classified by different write methods. A traditional MRAM is a magnetic field-switched MRAM utilizing electric line currents to generate magnetic fields and switch the magnetization direction of the recording layer in a magnetoresistive element at their cross-point location during the programming write. A spin-transfer torque (or STT)-MRAM has a different write method utilizing electrons' spin momentum transfer. Specifically, the angular momentum of the spin-polarized electrons is transmitted to the electrons in the magnetic material serving as the magnetic recording layer. According to this method, the magnetization direction of a recording layer is reversed by applying a spin-polarized current to the magnetoresistive element. As the volume of the magnetic layer forming the recording layer is smaller, the injected spin-polarized current to write or switch can be also smaller.

To record information or change resistance state, typically a recording current is provided by its CMOS transistor to flow in the stacked direction of the magnetoresistive element, which is hereinafter referred to as a "vertical spin-transfer method." Generally, constant-voltage recording is performed when recording is performed in a memory device accompanied by a resistance change. In a STT-MRAM, the majority of the applied voltage is acting on a thin oxide layer (tunnel barrier layer) which is about 10 angstroms thick, and, if an excessive voltage is applied, the tunnel barrier breaks down. More, even when the tunnel barrier does not immediately break down, if recording operations are repeated, the element may still become nonfunctional such that the resistance value changes (decreases) and information readout errors increase, making the element un-recordable. Furthermore, recording is not performed unless a sufficient voltage or sufficient spin current is applied. Accordingly, problems with insufficient recording arise before possible tunnel barrier breaks down.

Reading STT MRAM involves applying a voltage to the MTJ stack to discover whether the MTJ element states at high resistance or low. However, a relatively high voltage needs to be applied to the MTJ to correctly determine whether its resistance is high or low, and the current passed at this voltage leaves little difference between the read-voltage and the write-voltage. Any fluctuation in the electrical characteristics of individual MTJs at advanced technology nodes could cause what was intended as a read-current, to have the effect of a write-current, thus reversing the direction of magnetization of the recording layer in MTJ.

It has been known that a spin current can, alternatively, be generated in non-magnetic transition metal material by a so-called Spin Hall Effect (SHE), in which spin-orbit coupling causes electrons with different spins to deflect in different directions yielding a pure spin current transverse to an applied charge current. Recently discovered Giant Spin Hall Effect (GSHE), the generation of large spin currents transverse to the charge current direction in specific high-Z metals (such as Pt, $\beta$-Ta, $\beta$-W, doped Cu) is a promising solution to the voltage, current scaling and reliability problems in a spin torque transfer MRAM.

Due to the thermal stability requirement, the recording layer is typically is patterned into an oval or ellipse like shape with an aspect ratio larger than 1.0 for a desired uniaxial shape anisotropy. A spin torque coming from the spin Hall effect has to be large enough to overcome a large energy barrier to switch the magnetization of the recording layer from one energy minimum state to the other energy minimum state, depending upon the spin Hall current direction.

Thus, it is desirable to provide a SHE STT-MRAM structure having much reduced switching energy barrier for recording while providing high enough thermal energy barrier for good data retention.

BRIEF SUMMARY OF THE PRESENT INVENTION

The present invention comprises a three terminal magnetoresistive element having a functional magnetic coupling layer which is magnetically coupled to a recording layer of an MTJ junction stack through a coupling spacing layer and a giant-SHE base metal layer immediately adjacent to the functional magnetic coupling layer to produce a direct spin torque-induced switching of in-plane magnetization in the magnetic coupling layer and an indirect switching of the recording layer magnetization, with read-out using a magnetic tunnel junction with a large magnetoresistance.

An exemplary embodiment includes a structure of a three terminal SHE spin-transfer-torque magnetoresistive memory including a bit line positioned adjacent to selected ones of the plurality of magnetoresistive memory elements to supply a reading current across the magnetoresistive element stack and to supply a bi-directional spin Hall effect recording current, and accordingly to directly switch the magnetization of the functional magnetic coupling layer and indirectly switch the magnetization of the recording layer through a magnetic coupling. Since switch energy barrier is smaller than the thermal energy barrier, the magnetization of a recording layer can be readily switched or reversed to the direction in accordance with a direction of a current along the SHE-metal layer by applying a low write current.

The drawings are schematic or conceptual, and the relationships between the thickness and width of portions, the

DETAILED DESCRIPTION OF THE INVENTION

Figure 1:
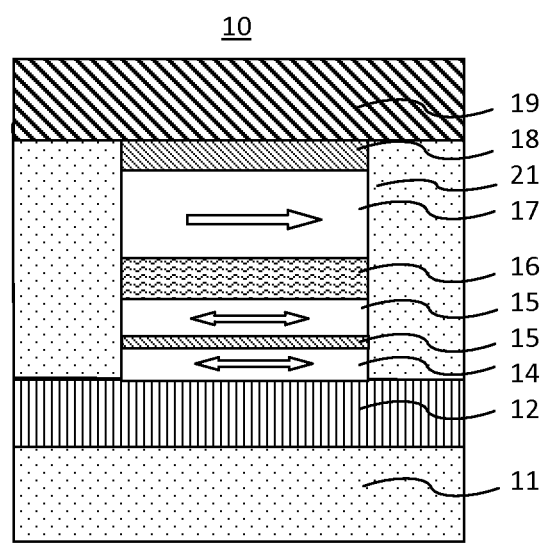
FIG. 1 is a cross-section of one memory cell in a three terminal SHE MRAM array.

In general, according to each embodiment, there is provided a three terminal magnetoresistive memory cell comprising:
- a SHE metal base layer provided on a surface of a substrate;
- a functional magnetic coupling layer provided on the top of the SHE base layer;
- a nonmagnetic coupling layer provided on the top surface of the functional magnetic coupling layer;
- a recording layer provided on the top surface of the nonmagnetic layer and having magnetic anisotropy in a film plane and having a variable magnetization direction;
- a tunnel barrier layer provided on the top surface of the recording layer;
- a reference layer provided on the top surface of the tunnel barrier layer having magnetic anisotropy in a film plane and having an invariable magnetization direction;
- a cap layer provided on the top surface of the reference layer as an upper electric electrode;
- a first bottom electrode provided on a first side of the SHE metal layer and electrically connected to the SHE metal layer;
- a second bottom electrode provided on a second side of the SHE metal layer and electrically connected to the SHE metal layer;
- a bit line provided on the top surface of the cap layer;
- two CMOS transistors coupled the plurality of magnetoresistive memory elements through the two bottom electrodes.
- There is further provided circuitry connected to the bit line, and two select transistors of each magnetoresistive memory cell.

Spin Hall effect consists of the appearance of spin accumulation on the lateral surfaces of an electric current-carrying sample, the signs of the spin directions being opposite on the opposing boundaries. When the current direction is reversed, the directions of spin orientation are also reversed. The origin of SHE is in the spin-orbit interaction, which leads to the coupling of spin and charge currents: an electrical current induces a transverse spin current (a flow of spins) and vice versa. In a giant spin Hall effect (GSHE), very large spin currents transverse to the charge current direction in specific high-Z metal (such as Pt, β-Ta, β-W, Pt, doped Cu) layer underneath a recording layer may switch the magnetization directions. A polarization ratio in the spin current depends on not only material but also its thickness. Typically, the spin current polarization ratio reached the maximum at a thickness of ~2 nm. A thin SHE layer made of beta-phase tungsten provides a higher spin polarization ratio and a higher resistivity than Ta or Pt SHE layer.

An exemplary embodiment includes a structure of a three terminal SHE spin-transfer-torque magnetoresistive memory including a bit line positioned adjacent to selected ones of the plurality of magnetoresistive memory elements to supply a reading current across the magnetoresistive element stack and to supply a bi-directional spin Hall effect recording current, and accordingly to directly switch the magnetization of the functional magnetic coupling layer and indirectly switch the magnetization of the recording layer through a magnetic coupling. The functional magnetic layer is made of ferromagnetic material having very low damping constant, a polarized spin current flowing perpendicularly to the functional magnetic layer applies a spin transfer torque mainly on the functional layer and causes a switching of the magnetization. Since such a switch energy barrier is smaller than the thermal energy barrier, the magnetization of a recording layer can be readily switched or reversed to the direction in accordance with a direction of a current along the SHE-metal layer by applying a low write current.

The following detailed descriptions are merely illustrative in nature and are not intended to limit the embodiments of the subject matter or the application and uses of such embodiments. Any implementation described herein as exemplary is not necessarily to be construed as preferred or advantageous over other implementations. Furthermore, there is no intention to be bound by any expressed or implied theory presented in the preceding technical field, background, brief summary, or the following detailed description.

FIG. 1 is a cross-sectional view of a three terminal magnetoresistive memory cell 10 in a STT-MRAM array having a SHE induced spin transfer switching. The magnetoresistive memory cell 10 is configured by a bit line 19, a cap layer 18, a reference layer 17, a tunnel barrier 16, a recording layer 15, a non-magnetic spacing layer 14, a functional magnetic coupling layer 13, a SHE metal layer 12, a dielectric substrate 11, a bottom electrode 20 and a dielectric layer 21. Both the functional magnetic coupling layer and the recording layer have uniaxial anisotropies and variable magnetization in a film plane. The reference layer has a fixed magnetization in a film plane. The reference layer can be a synthetic anti-ferromagnetic structure having a nonmagnetic metal layer sandwiched by two ferromagnetic layers which have an anti-parallel coupling. Further, an anti-ferromagnetic (AFM) pinning layer can be added on top of the reference layer to fix the reference layer magnetization direction.

Figure 2A:
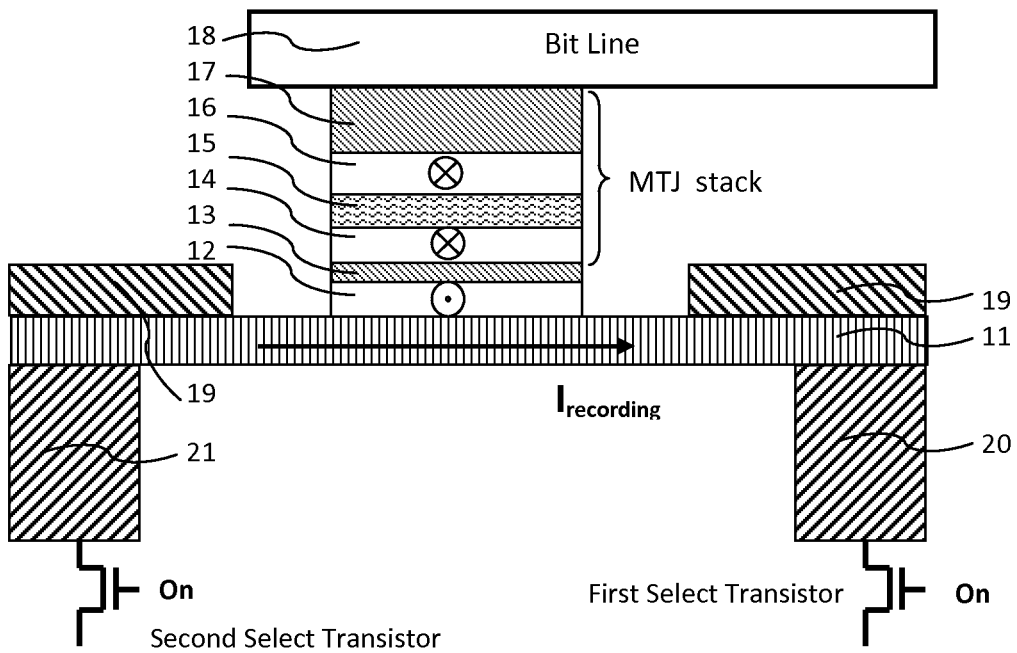
FIGS. 2(A, B) are schematics of using spin Hall effect writing current to directly reverse the coupling layer magnetization to the direction in accordance with a direction of a current along the SHE-metal and reverse the recording layer magnetization through an anti-parallel coupling between the coupling layer and the recording layer.
Figure 2B:
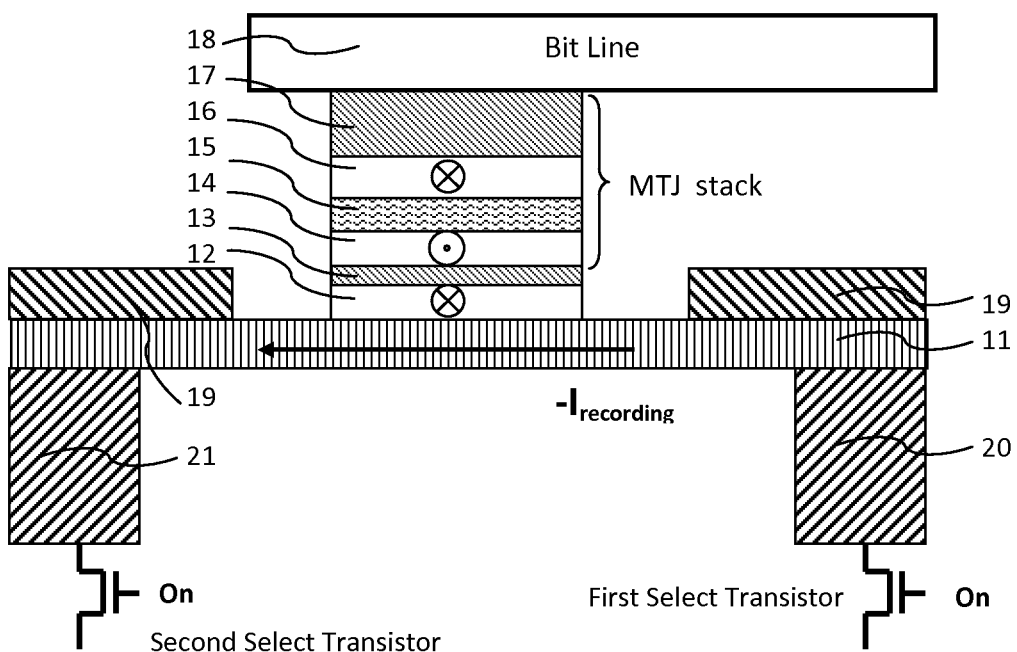

As a first embodiment, FIGS. 2A and 2B show a magnetoresistive element 50 illustrating the methods of operating a spin-transfer-torque magnetoresistive memory: a SHE spin transfer current driven recording layer magnetization to two directions in accordance with directions of a SHE current along the SHE-metal layer, respectively. A circuitry, which is not shown here, is coupled to two select transistors for providing a bi-directional current in the SHE metal layer between a first bottom electrode and a second electrode. The magnetoresistive element 50 comprises: a bit line 18, an MTJ stack comprising a cap layer 17, a reference layer 16, a tunnel barrier 15 and a recording layer 14, a non-magnetic spacing layer 13, a functional magnetic coupling layer 12, a SHE metal base layer 11, a bottom electrode conductivity enhancement layer 19, a first VIA 20 connecting a first bottom electrode and a first select transistor, a second VIA 21 connecting a second bottom electrode and a first select transistor. The SHE metal layer is made by a high-Z metal, such as Pt, β-Ta, β-W, Pt, doped Cu, having a thickness in a range between 1.5 nm and 6 nm. The functional magnetic coupling layer and the recording layer are magnetically anti-parallel coupled with each other through a non-magnetic spacing layer. The non-magnetic spacing layer is made of a metal material, selected from Ru, Rh, Cr, etc. As the write current is applied to flow along the SHE base layer, a perpendicular polarized spin current would flow into the functional layer. As the spin electron density or spin transfer torque is large enough, the functional layer magnetization would be switched driven by the spin transfer torque and the recording layer magnetization would switch correspondingly. Since the rotation of the recording layer magnetization cancels part of the demag charge or field from the functional layer, the switching energy barrier is smaller than its thermal energy barrier.

Figure 3A:
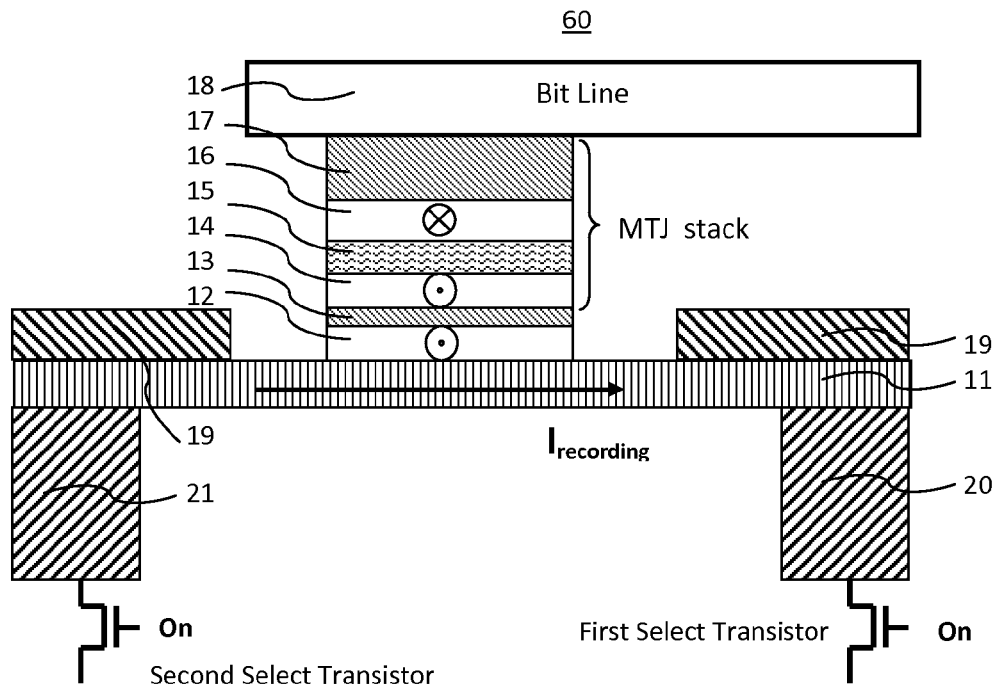
FIGS. 3(A, B) are schematics of using spin Hall effect writing current to directly reverse the coupling layer magnetization to the direction in accordance with a direction of a current along the SHE-metal and reverse the recording layer magnetization through a parallel coupling between the coupling layer and the recording layer.
Figure 3B:
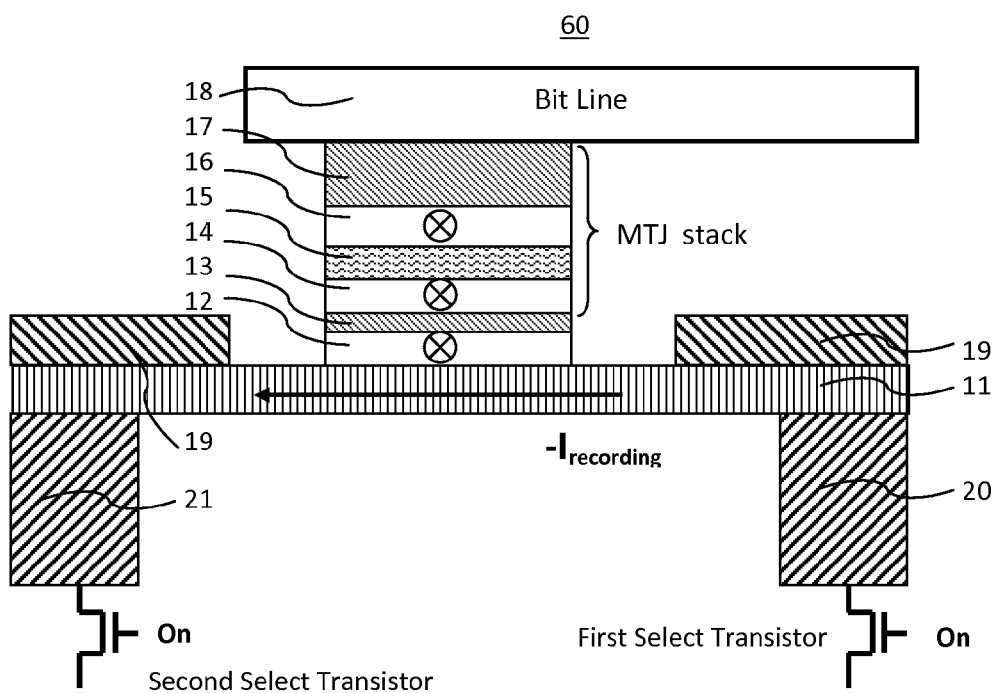

As a second embodiment, FIGS. 3A and 3B show magnetoresistive element 60 illustrating the methods of operating a spin-transfer-torque magnetoresistive memory: a SHE spin transfer current driven recording layer magnetization to two directions in accordance with directions of a SHE current along the SHE-metal layer, respectively. A circuitry, which is not shown here, is coupled to two select transistors for providing a bi-directional current in the SHE metal layer between a first bottom electrode and a second electrode. The magnetoresistive element 50 comprises: a bit line 18, an MTJ stack comprising a cap layer 17, a reference layer 16, a tunnel barrier 15 and a recording layer 14, a non-magnetic spacing layer 13, a functional magnetic coupling layer 12, a SHE metal base layer 11, a bottom electrode conductivity enhancement layer 19, a first VIA 20 connecting a first bottom electrode and a first select transistor, a second VIA 21 connecting a second bottom electrode and a first select transistor. The SHE metal layer is made by a high-Z metal, such as Pt, β-Ta, β-W, Pt, doped Cu, having a thickness in a range between 1.5 nm and 6 nm. The functional magnetic coupling layer and the recording layer are magnetically parallel coupled with each other through a non-magnetic spacing layer. The non-magnetic spacing layer is made of a metal material, selected from Ta, W, Hf, Cu, Au, Ag, etc., or made of a thin layer of oxide, or nitride, oxynitride, comprising an element selected from the group consisting of Si, Mg, Ta, Ti, Fe, Ni, V, Zr, Co, Al.

While certain embodiments have been described above, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

The invention claimed is:

1. A three terminal SHE spin transfer magnetoresistive memory comprising a control circuitry and at least one memory cell comprising:
  a SHE metal base layer provided on a surface of a substrate;
  a functional magnetic coupling layer provided on the top of the SHE base layer;
  a nonmagnetic coupling layer provided on the top surface of the functional magnetic coupling layer;
  a recording layer provided on the top surface of the non-magnetic layer and having magnetic anisotropy in a film plane and having a variable magnetization direction;
  a tunnel barrier layer provided on the top surface of the recording layer;
  a reference layer provided on the top surface of the tunnel barrier layer having magnetic anisotropy in a film plane and having an invariable magnetization direction;
  a cap layer provided on the top surface of the reference layer as an upper electric electrode;
  a first bottom electrode provided on a first side of the SHE metal layer and electrically connected to the SHE metal layer;
  a second bottom electrode provided on a second side of the SHE metal layer and electrically connected to the SHE metal layer;
  a bit line provided on the top surface of the cap layer;
  two CMOS transistors coupled the plurality of magnetoresistive memory elements through the two bottom electrodes.

There is further provided circuitry connected to the bit line, and two select transistors of each magnetoresistive memory cell, The control circuitry coupled through the bit line and the two select transistors to selected ones of the plurality of magnetoresistive memory elements to supply a reading current across the magnetoresistive element stack and two bottom electrodes and to supply a bi-directional spin Hall effect recording current, and accordingly to directly switch the magnetization of the functional magnetic coupling layer and indirectly switching the magnetization of the recording layer through the coupling between the functional magnetic coupling layer and the recording layer.

2. The element of claim 1, wherein said SHE metal layer is made of a high-Z metal, preferred to be beta-phase metal of W, Ta, Hf.

3. The element of claim 1, wherein said SHE metal layer is made of a doped or non-doped metal layer comprising at least one element selected from the group consisting of Pt, Pd, Nb, Mo, Ru, Re, Os, Ir, Au, Tl, Pb, Bi, doping agent is preferred to be selected from Ni, Fe, Co, Cr, Mn, V, Y and rare earth elements.

4. The element of claim 1, wherein the thickness of said SHE layer is preferred to be more than 1.5 nm and less than 10 nm.

5. The element of claim 1, wherein said functional magnetic coupling layer is made of a ferromagnetic layer having small damping constant, preferred to be CoFe, CoB, CoFeB, CoNiFe, FeB.

6. The element of claim 1, wherein said recording layer is made of a ferromagnetic layer, preferred to be CoFeB or CoFe, CoB, NiFe, CoNiFe, CoNi, FeB, or their multilayer.

7. The element of claim 1, wherein said recording layer anti-parallel coupled to said functional magnetic coupling layer through said non-magnetic spacing layer.

8. The element of claim 1, wherein said non-magnetic spacing layer is a metal layer selected from the group consisting of Ru, Rh, Cr.

9. The element of claim 1, wherein said recording layer is parallel coupled to said functional magnetic coupling layer through said non-magnetic spacing layer.

10. The element of claim 1, wherein said non-magnetic spacing layer is a metal layer selected from the group consisting of Ta, W, Hf, Cu, Au, Ag, and having a thickness less than 0.5 nm.

11. The element of claim 1, wherein said non-magnetic spacing layer is made of a thin layer of oxide, or nitride, oxynitride, comprising an element selected from the group consisting of Si, Mg, Ta, Ti, Fe, Ni, V, Zr, Co, Al, and having a thickness less than 0.5 nm.

12. The element of claim 1, wherein said recording layer is a multi-layer comprising ferromagnetic sub-layers and optional nonmagnetic insertion sub-layers containing at least one element selected from Ta, Hf, Zr, Ti, Mg, Nb, W, Mo, Ru, Al, Cu, Si and having a thickness less than 0.5 nm.

13. The element of claim 1, wherein the thickness of said recording layer is more than 1.2 nm and less than 10 nm.

14. The element of claim 1, wherein said recording layer is patterned into an in-plane shape having an aspect ratio between 1.2 and 5.

15. The element of claim 1, wherein said tunnel barrier layer is made of a metal oxide or a metal nitride, a metal oxynitride, preferred to be MgO, ZnO, MgZnO, MgN, MgON.

16. The element of claim 1, wherein said reference layer is a ferromagnetic layer having an anisotropy at least 20% larger than the anisotropy of the recording layer.

17. The element of claim 1, wherein said reference layer is a synthetic anti-ferromagnetic multilayer.

18. The element of claim 1, wherein said reference layer is a synthetic anti-ferromagnetic multilayer pinned by an anti-ferromagnetic layer.

19. The element of claim 1, wherein the thickness of said functional magnetic coupling layer is more than 1.2 nm and less than 10 nm.

20. The element of claim 1, wherein said functional magnetic coupling layer is patterned into an in-plane shape having an aspect ratio between 1.2 and 5, and having in-plane dimensions equal to or larger than that of the recording layer.

* * * * *